US008443243B2

(12) United States Patent
Matsumoto et al.

(10) Patent No.: US 8,443,243 B2
(45) Date of Patent: May 14, 2013

(54) SEMICONDUCTOR INTEGRATED CIRCUIT DEVICE AND METHOD FOR EVALUATING AN EYE-OPENING MARGIN

(75) Inventors: Akira Matsumoto, Ome (JP); Daisuke Hamano, Hachioji (JP); Atsuhiro Hayashi, Akishima (JP); Kazuhisa Suzuki, Hamura (JP)

(73) Assignee: Hitachi, Ltd., Tokyo (JP)

( * ) Notice: Subject to any disclaimer, the term of this patent is extended or adjusted under 35 U.S.C. 154(b) by 1043 days.

(21) Appl. No.: 12/367,067

(22) Filed: Feb. 6, 2009

(65) Prior Publication Data
US 2009/0224809 A1 Sep. 10, 2009

(30) Foreign Application Priority Data
Mar. 6, 2008 (JP) .................................. 2008-055696

(51) Int. Cl.
G06F 11/00 (2006.01)
(52) U.S. Cl.
USPC ........................................................ 714/715
(58) Field of Classification Search .................. 714/703, 714/715, 814
See application file for complete search history.

(56) References Cited

U.S. PATENT DOCUMENTS

| | | | | |
|---|---|---|---|---|
| 4,018,190 A * | 4/1977 | Henault | ............................. | 123/3 |
| 6,430,715 B1 * | 8/2002 | Myers et al. | .................. | 714/704 |
| 7,002,368 B2 | 2/2006 | Lee et al. | | |
| 7,082,253 B2 * | 7/2006 | Dominic et al. | ............... | 385/147 |
| 7,275,195 B2 * | 9/2007 | Martinez | ........................ | 714/733 |
| 7,349,506 B2 * | 3/2008 | Shizuki | ......................... | 375/350 |
| 8,249,139 B2 * | 8/2012 | Hsu | ................. | 375/235 |
| 2002/0040459 A1 * | 4/2002 | Watanabe et al. | ............. | 714/738 |
| 2003/0123594 A1 * | 7/2003 | Glenn et al. | ................... | 375/373 |
| 2004/0022339 A1 * | 2/2004 | Nakao | ............................ | 375/376 |
| 2004/0170244 A1 * | 9/2004 | Cranford et al. | ............... | 375/373 |
| 2005/0135470 A1 * | 6/2005 | Momtaz | ......................... | 375/233 |
| 2007/0047680 A1 | 3/2007 | Okamura | | |
| 2007/0160173 A1 * | 7/2007 | Takeuchi | ....................... | 375/355 |
| 2008/0133958 A1 * | 6/2008 | Cranford et al. | .............. | 713/600 |

FOREIGN PATENT DOCUMENTS

JP 2003-17999 1/2003
JP 2007-60655 3/2007

\* cited by examiner

*Primary Examiner* — Scott Baderman
*Assistant Examiner* — Elmira Mehrmanesh
(74) *Attorney, Agent, or Firm* — Mattingly & Malur, PC

(57) ABSTRACT

An eye-opening margin measurement method for a high-speed serial data reception circuit which uses a circuit for eye-opening margin measurement involving operation of a clock data recovery circuit without fixing the clock phase. In this method, an error acceleration test can also be made on received data by giving an offset pulse signal to phase information to add a jitter component. The method uses a semiconductor integrated circuit device which includes a serializer/deserializer circuit (SerDes) for receiving serial data and a reference serializer/deserializer circuit (Ref_SerDes) for receiving an accompanying clock signal. The SerDes circuit converts received serial data into parallel data through a recovery clock whose phase is controlled using phase control signal P_CS generated by the Ref_SerDes circuit. An offset pulse signal Offset_Pulse from the pulse-forming circuit is applied to the phase control signal P_CS to make eye-opening margin measurement.

7 Claims, 9 Drawing Sheets

SEMICONDUCTOR INTEGRATED CIRCUIT DEVICE AND METHOD FOR EVALUATING AN EYE-OPENING MARGIN

CLAIM OF PRIORITY

The present application claims priority from Japanese patent application JP 2008-055696 filed on Mar. 6, 2008, the content of which is hereby incorporated by reference into this application.

FIELD OF THE INVENTION

The present invention relates to a semiconductor device and more particularly to a technique which measures an eye-opening margin as an index for received data signal waveform quality for use in high speed data transmission between devices.

BACKGROUND OF THE INVENTION

In recent years, serial data transmissions have been the mainstream in high speed data transmissions between devices. In a high speed serial data transmission between semiconductor devices, a serializer/deserializer (SerDes) is used to convert outgoing parallel data into serial data and convert incoming serial data into parallel data. Since attenuation in transmission lines is more serious at higher transmission speed, it is important to evaluate the waveform quality in the reception circuit of the SerDes circuitry.

An attenuated waveform in high speed transmission is received and recovered by a clock data recovery circuit (CDR) For clock data recovery, the embedded clock system and accompanying clock system are available.

In the embedded clock system, data is sent with clock information embedded therein. The clock data recovery circuit separates data and clock information in received data to recover the data.

In the accompanying clock system, in the reception circuit of the SerDes with data lanes and accompanying clock lanes, a clock having phase information extracted from the clock data recovery circuit of an accompanying clock lane is sent to a data lane to recover the clock for the data lane. In the accompanying clock lane system, a clock is transmitted simultaneously with high-speed serial data and distributed to each data lane to enable transmission and reception of high-speed serial data. Also, since skews (time lags) between data and clock signals do not occur, data can be received with reference to the accompanying clock. Furthermore, unlike the embedded clock system, in the accompanying clock system, the eye-opening margin can be measured while the clock data recovery circuit follows changes in the received data in the same way as in normal operation (namely, jitter components are included). Besides, since the accompanying clock signal always switches between 1 and 0, even if received data includes a succession of same signs, the data can be received according to a phase control signal from the clock data recovery circuit. SerDes circuitry including such a clock data recovery circuit of a clock lane is disclosed in JP-A No. 2003-017999.

One approach to evaluating the received data waveform quality is eye-opening margin measurement. In various serial data transmission systems, the eye-opening at the transmitting and receiving ends is defined (compliance eye diagrams). Eye-opening margin measurement is to a method in which all shifts of waveform signals are overlapped and timing margins and voltage margins are measured at a time according to eye-opening.

Generally the embedded clock system is used for eye-opening margin measurement. Data synchronized with a clock signal is transmitted through a transmission line and the clock signal is extracted from the received data by a clock data recovery circuit on the receiving circuit and the received data is recovered. JP-A No. 2007-060655 discloses an eye-opening margin measurement method according to this embedded clock system.

SUMMARY OF THE INVENTION

In the embedded clock system, the clock data recovery circuit sweeps a fixed clock phase to measure eye-opening. Therefore, since the clock recovery circuit is inactive, jitter components generated by actual operation of the clock data recovery circuit are not included and only jitter distribution information can be obtained.

In the accompanying clock system, the clock data recovery circuit of a data lane follows a clock having phase information from the clock data recovery circuit of an accompanying clock lane. However, because a clock signal itself has a jitter component, it is impossible to measure the eye-opening margin accurately. Besides, in Gbps-order transmissions, considering lane-to-lane skews of high-speed serial data or distribution skews of accompanying clocks, eye-opening margin cannot be measured accurately by a simple accompanying clock system.

The present invention has been made in view of the above circumstances and an object of the invention is to measure the eye-opening margin with high accuracy in a high-speed serial data reception circuit and more particularly to enable eye-opening margin measurement of received data including the jitter component of the clock data recovery circuit of a data lane.

A preferred embodiment of the invention which will be disclosed herein is briefly outlined below. The present invention provides a semiconductor device which makes eye-opening margin measurement, in a normal operational state where received data follows phase information from a clock data recovery circuit of an accompanying clock lane, by changing the phase information of the accompanying clock lane to an offset pulse signal of a pulse-forming circuit to give a desired pulse and select a clock phase.

The invention makes it possible to make eye-opening margin measurement with high accuracy in a high-speed serial data reception circuit. Particularly, it is possible to measure the eye-opening margin of received data including a jitter component of a clock data recovery circuit of a data lane. Also, in the measurement circuit, an error acceleration test can be conducted by applying an offset pulse from the pulse-forming circuit to add any jitter component.

BRIEF DESCRIPTION OF THE DRAWINGS

FIGS. 5A, 5B and 5C are conceptual diagrams according to the embodiment of the invention, in which FIG. 5A shows a clock edge (pointer) of a recovery clock, FIG. 5B illustrates a data lane pointer following an accompanying clock lane pointer, and FIG. 5C illustrates shift of the accompanying clock lane pointer;

DETAILED DESCRIPTION OF THE PREFERRED EMBODIMENT

Figure 1:
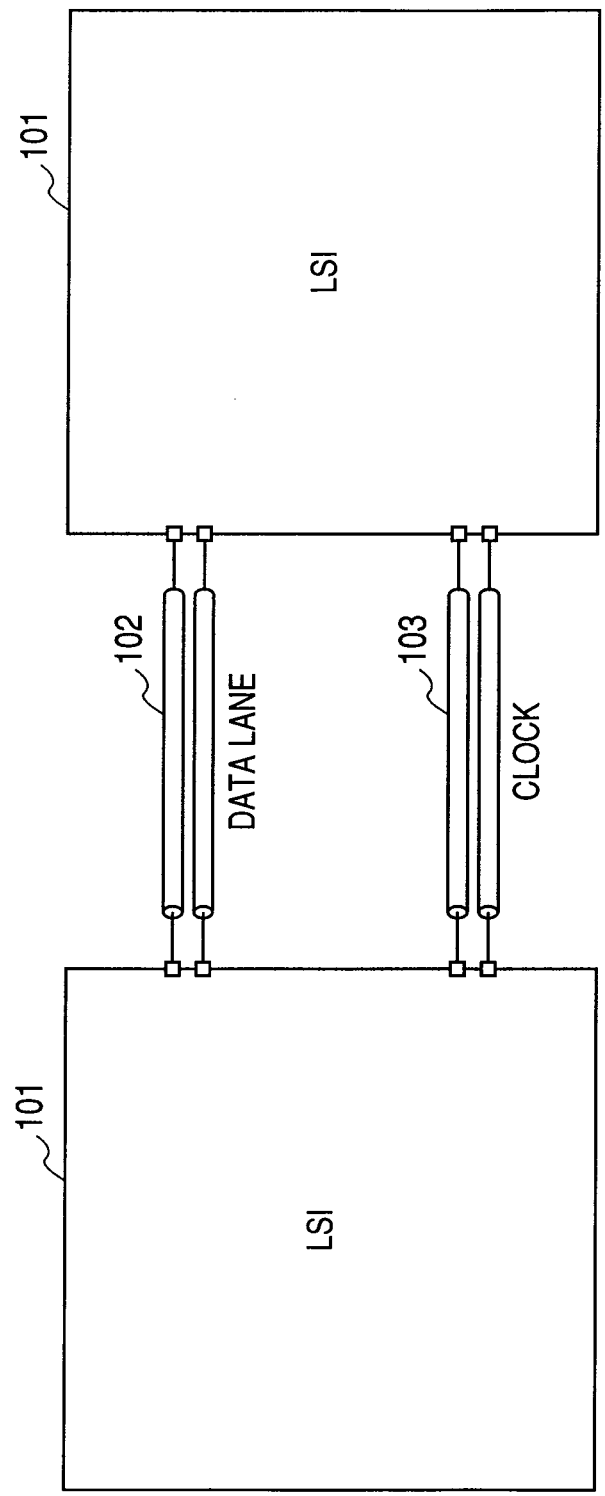
FIG. 1 is a block diagram of a semiconductor device transmission system configuration according to an embodiment of the present invention.

Next, the preferred embodiment of the present invention will be described in detail. FIG. 1 shows a high-speed serial data transmission system configuration according to the embodiment of the present invention. The high-speed serial data transmission/reception system includes LSIs 101 and a transmission system comprised of data lanes 102 and accompanying clock lanes 103.

The LSIs 101 are semiconductor devices capable of transmitting and receiving serial data at high speed. The data lanes 102 transmit high-speed serial data generated between the LSIs 101. The accompanying clock lanes 103 transmit clock signals having phase information representative of all data lanes.

Figure 2:
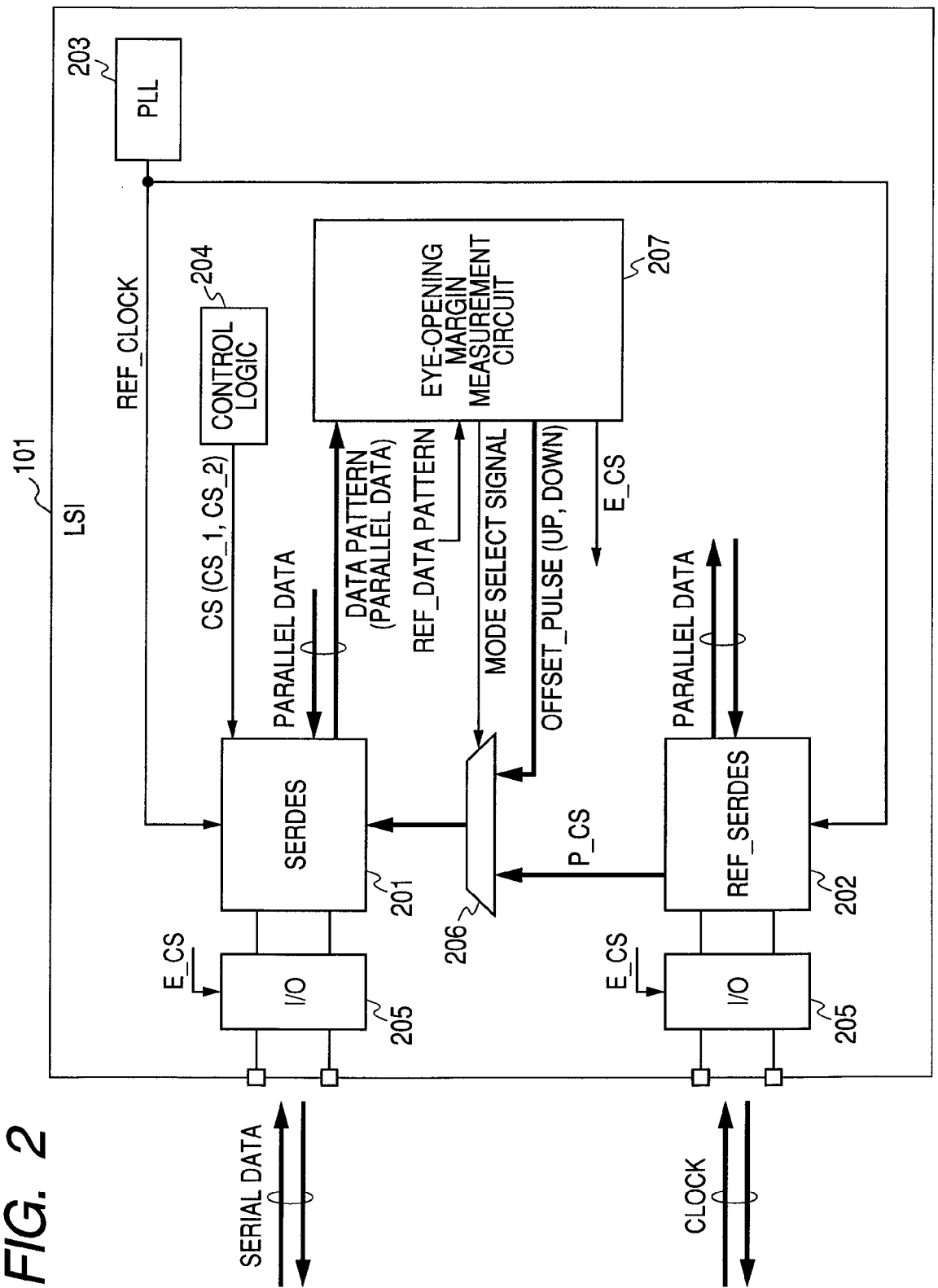
FIG. 2 is a block diagram of a semiconductor device configuration according to the embodiment of the invention.

FIG. 2 shows details of an LSI 101 in FIG. 1. It is comprised of: an accompanying clock high-speed serial data transmission system which includes multiple SerDes circuits 201, a Ref_SerDes circuit 202, a Phase Locked Loop circuit 203 (PLL), a control logic circuit 204 (Control Logic) and I/O circuits 205 with an equalizer function; a selector circuit 206 for switching between a phase control signal (P_CS) and an offset pulse signal (Offset_Pulse); and an eye-opening margin measurement circuit 207.

The SerDes circuit 201 converts the high-speed serial data received by a data lane 102 into parallel data and converts the parallel data processed by the LSI into serial data and transmits it. The Ref_SerDes circuit 202 converts the accompanying clock (serial data) received by an accompanying clock lane 103 into parallel data and converts the parallel data into serial data and transmits it as an accompanying clock. Also the Ref_SerDes circuit 202 distributes the phase information extracted from the accompanying clock as signal P_CS (UP/FIX/DOWN) to each SerDes circuit 201. The PLL circuit 203 generates a reference clock (Ref_Clock) and sends it to each circuit block. The control logic circuit 204 supplies control signals CS (CS_1, CS_2) to each SerDes circuit. The phase control signal P_CS from the Ref_SerDes circuit 202 of the accompanying clock lane is distributed to the SerDes circuits 201 of the data lanes. The eye-opening margin measurement circuit 207 changes the select signal of the selector circuit 206 from the phase control signal P_CS (UP/FIX/DOWN) to offset pulse signal Offset_Pulse (UP/DOWN) to give a desired pulse and thereby select the clock phases for the SerDes circuits 201. Furthermore, it compares the received data (Data Pattern) with the reference data (Ref_Data Pattern) and counts errors at each clock phase. If the eye-opening is not up to standard, the I/O circuit 205 is optimized by equalizer control signal E_CS. Details of operation will be explained later.

Figure 3A:
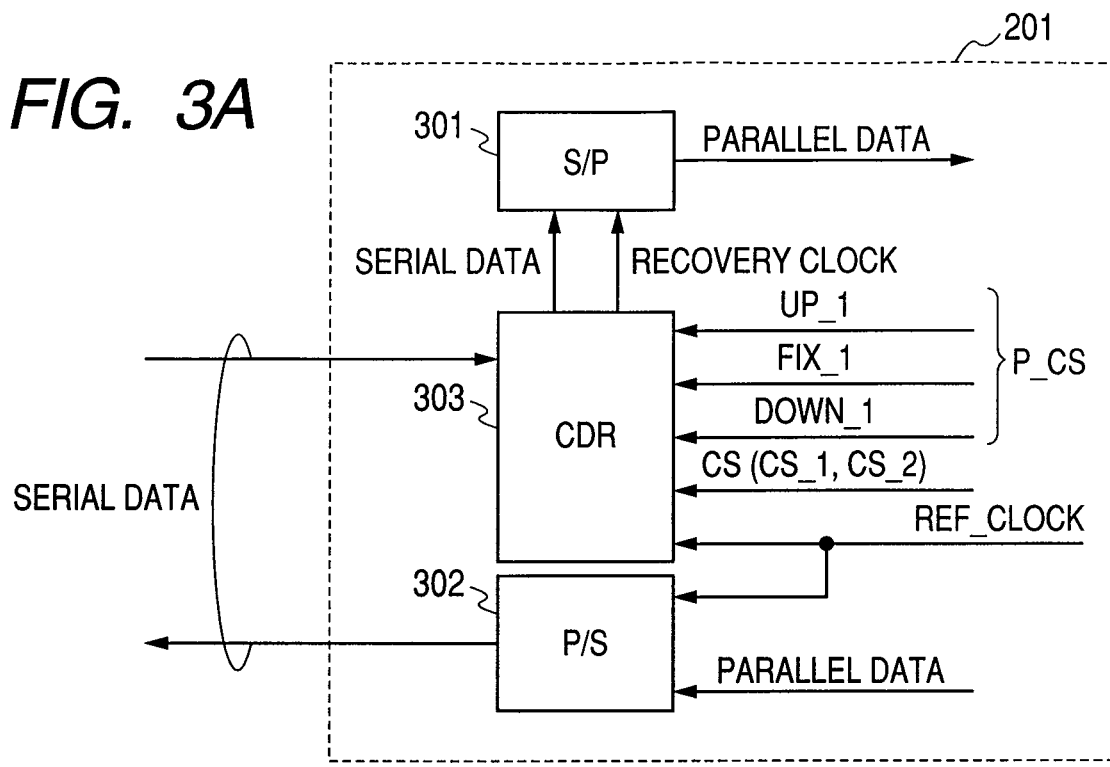
FIG. 3A is a block diagram of a serializer/deserializer circuit (SerDes) shown in FIG. 2

FIG. 3A shows details of the SerDes circuit 201 shown in FIG. 2. The SerDes circuit 201 includes a deserializer 301 (S/P; Serial to Parallel converter), a serializer 302 (P/S; Parallel to Serial converter), and a clock data recovery circuit 303 (CDR).

The deserializer 301 (S/P) receives incoming serial data using a recovery clock recovered by the clock data recovery circuit 303 (CDR) and converts it into parallel data. Since the deserializer 301 has an ordinary structure, description of it is omitted. The serializer 302 (P/S) converts outgoing parallel data into serial data. Since the serializer 302 has an ordinary structure, description of it is omitted.

Here, UP_1, FIX_1, and DOWN_1 are phase control signals P_CS from the clock data recovery circuit 303 (CDR) included in the Ref_SerDes circuit 202. The SerDes circuit 201 recovers serial data based on the phase information. The parallel data is converted into serial data by the serializer 302 (P/S) and the serial data is transmitted. The reference clock (Ref_Clock) synchronizes the receiving circuit with the transmitting circuit.

Figure 3B:
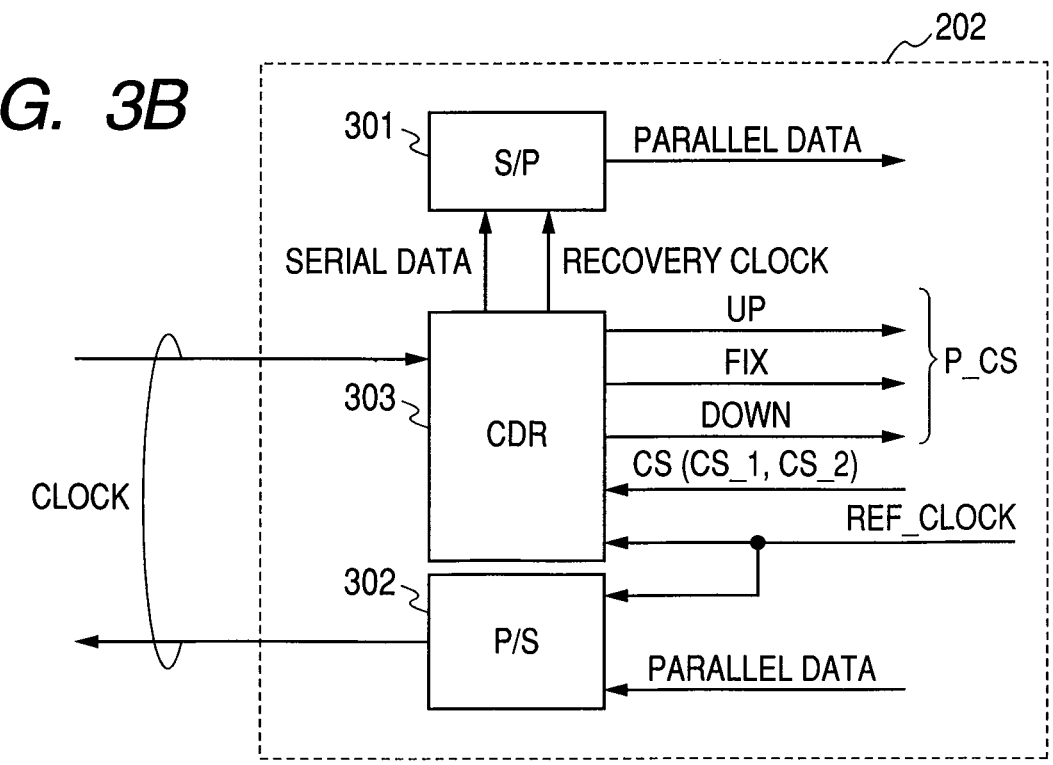
FIG. 3B is a block diagram of a reference serializer/deserializer circuit (Ref_SerDes)

FIG. 3B shows details of the Ref_SerDes circuit 202 shown in FIG. 2. The Ref_SerDes circuit 202 in FIG. 2 receives an accompanying clock and distributes it through phase control signals P_CS (CDR) (UP_1, FIX_1, and DOWN_1) from the clock data recovery circuit 303 to the SerDes circuits 201 of the data lanes.

Figure 4:
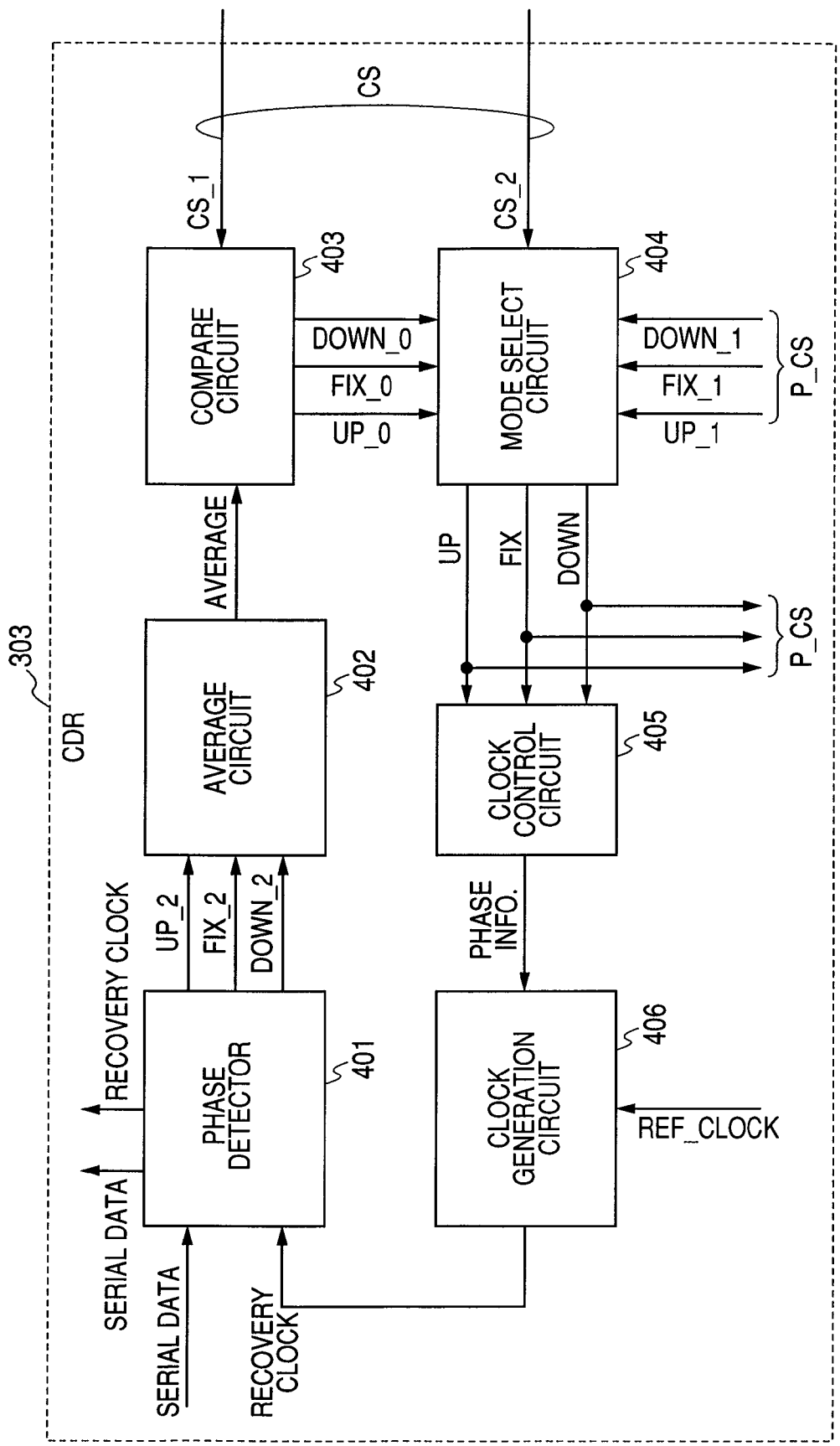
FIG. 4 is a block diagram of a clock data recovery circuit (CDR) according to the embodiment of the invention.

FIG. 4 shows details of the clock data recovery circuit 303 (CDR) as a component of the SerDes circuit 201. The clock data recovery circuit 303 (CDR) includes a phase detector 401, an average circuit 402, a compare circuit 403, a mode select circuit 404, a clock control circuit 405, and a clock generation circuit 406.

The phase detector 401 generates phase difference information (UP_2, FIX_2, DOWN_2) according to phase difference between the received data (serial data) from the I/O circuit 205 and the recovery clock from the clock generation circuit 406. As phase difference information, UP_2 is a phase delay signal indicating that the recovery clock phase is delayed as compared to the serial data phase, FIX_2 is a phase fixed signal indicating that the phase difference between the recovery clock and serial data is within a prescribed range, and DOWN_2 is a phase advance signal indicating that the recovery clock phase is advanced as compared to the serial data phase. The recovery clock is sent to the deserializer 301 (S/P) to convert the serial data into parallel data.

The average circuit 402 has a function to calculate the time average of phase difference information (UP_2, FIX_2, DOWN_2) sent from the phase detector 401.

The compare circuit 403 can compare numerical data from the average circuit 402 with a threshold at a timing from outside the clock data recovery circuit (CDR) 303. If comparison of the numerical data with the threshold reveals that the data is a positive value and larger than the positive threshold, the circuit outputs phase advance signal UP_0, if the numerical data is a negative value and smaller than the negative threshold, it outputs phase delay signal DOWN_0, and in other cases, it outputs phase fix signal "FIX_0." The threshold is supplied through a control signal CS_1 from the control logic circuit 204.

The mode select circuit 404 selects either clock phase control signal P_CS (UP_1/FIX_1/DOWN_1) determined autonomously by the clock data recovery circuit 303 (CDR) of the accompanying clock lane 103 or offset pulse (UP/

DOWN) from the eye-opening margin measurement circuit 207 or UP_0/FIX_0/DOWN_0 signal determined autonomously by the clock data recovery circuit 303 (CDR) of each data lane 102, and sends it as a phase control signal (UP/FIX/DOWN) to the clock control circuit 405.

Selection of these signals is made by a control signal CS 2. When phase control signal P_CS is selected, the data recovery circuit 303 (CDR) of the data lane 102 can make serial transmission with high accuracy, following the phase information of the accompanying clock lane. When the clock data recovery circuit 303 (CDR) is applied to the accompanying clock lane, UP/FIX/DOWN signal from the mode select circuit 404 as the clock control signal P_CS is distributed to the clock data recovery circuit 303 (CDR) of each data lane 102.

The first function of the mode select circuit 404 is described below. Usually, received data which enters the clock data recovery circuit 303 (CDR) generates a data edge due to frequent change in data value. The clock data recovery circuit 303 (CDR) adjusts the recovery clock phase by calculation of phase difference between the data edge and the recovery clock. However, if received data includes successive same-sign data, such a data edge is not generated and effective phase comparison with the recovery clock cannot be made. This means that in case of successive same-sign data, the recovery clock phase for the clock data recovery circuit 303 (CDR) is not controlled accurately. If the data sign is inverted after a succession of same-sign data, the SerDes circuit may not receive the received data. In order to prevent this, data whose data edge frequently changes (clock signal in this embodiment) is used as received data to the Ref_SerDes 202 circuit among the SerDes circuits 201, as shown in FIG. 2, so that effective information on phase difference between data edge and recovery clock is always obtained and phase control signal P_CS (UP/FIX/DOWN) is determined to control the recovery clock. Therefore, the signal which the Ref_SerDes circuit 202 receives should be such a signal in which the data sign is inverted more frequently than in ordinary data. It is not limited to an accompanying clock signal whose value changes regularly and for example it may be a signal whose value changes randomly. Each SerDes circuit 201 controls the phase of recovery clock using two signals, namely UP_0/FIX_0/DOWN_0 signal determined autonomously by it and phase control signal P_CS (UP/FIX/DOWN) determined autonomously by the Ref_SerDes circuit 202, in order to prevent deterioration in the accuracy of recovery clock phase control due to a decline in the edge generation frequency of received data.

Next, the second function of the mode select circuit 404 is explained. In the initial stage (training period) of operation of the mode select circuit 404, each SerDes circuit 201 is synchronized with the received data, then a sequence for controlling the phase of the recovery clock of the clock data recovery circuit 303 (CDR) is created using the phase control signal P_CS (UP/FIX/DOWN) from the Ref_SerDes circuit 202. This sequence cancels out timing variation among received data as caused by transmission lines and variation among clock data recovery circuits 303 (CDR). After switching to the phase control signal P_CS (UP/FIX/DOWN) from the Ref_SerDes circuit 202 by stopping the circuit used for autonomous phase control of each clock data recovery circuit 303 (CDR) except the Ref_SerDes circuit 202, high reception accuracy is maintained and power consumption of the whole device can be reduced.

For the clock delivery circuit 303 (CDR), external clock phase control is also done. The mode select circuit 404 can receive as many kinds of external signals as the circuit capacity and operation speed permit, and make mode selection for them. By controlling the recovery clock phase for the clock data recovery circuit 303 through an upper-level logic instead of the Ref_SerDes circuit 202, this approach can be used not only in normal operation but also for other purposes such as performance evaluation of the clock data recovery circuit 303 (CDR).

The clock control circuit 405 performs a function to hold the phase of a clock entering the phase detector 401 and alter or hold the phase according to UP/FIX/DOWN signal from the mode select circuit 404.

The clock generation circuit 406 adjusts the electric current to generate a clock in response to a subtle phase change, by switching operation according to phase information from the clock control circuit 405.

Figure 5A:
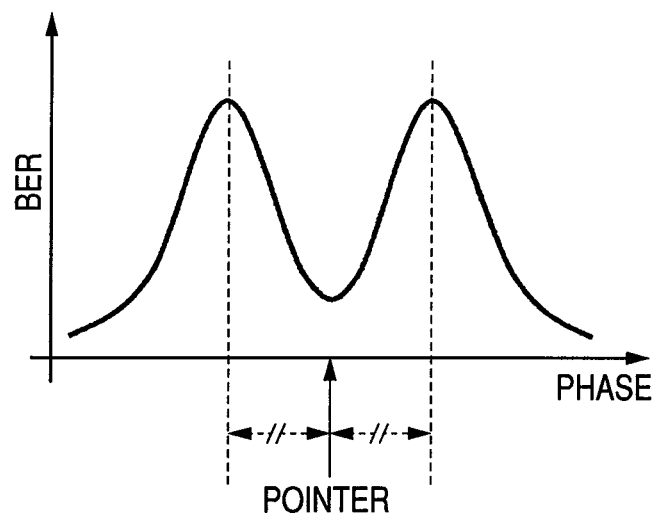
Figure 5B:
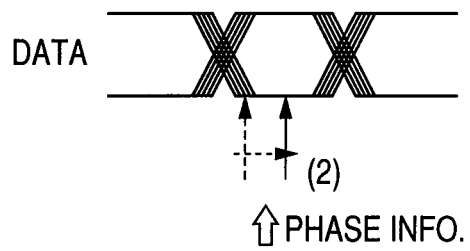
Figure 5C:
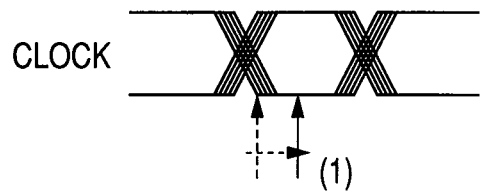

Phase control of the clock data recovery circuit 303 (CDR) is explained below referring to FIGS. 5A, 5B and 5C. FIG. 5A is a graph where the horizontal axis represents clock phase and the vertical axis represents bit error rate (BER) and the arrow (↑) shows the clock edge (pointer) of a recovery clock generated by the clock generation circuit 406. In the initial stage of operation, as shown in FIG. 5A, the clock data recovery circuit 303 of each lane receives an incoming data signal and controls the pointer position using the UP_0/FIX_0/DOWN_0 signal generated autonomously by the clock data recovery circuit 303 (CDR) of each lane and determines the clock phase at a point where the number of errors is the smallest with respect to input data. FIG. 5B illustrates that the pointer of the data lane 102 follows the pointer of the accompanying clock lane. As shown in FIG. 5B, in normal operation, the pointer position is controlled using phase control signal P_CS (UP/FIX/DOWN) distributed from the clock data recovery circuit 303 (CDR) of the accompanying clock lane, so the clock data recovery circuit 303 (CDR) of each data lane shifts the clock phase of the pointer. Specifically, when the pointer of the CDR circuit 303 of the accompanying clock lane 102 shifts in response to change in the recovery clock as indicated by ① in FIG. 5C, the position of the pointer of the clock data recovery circuit 303 (CDR) of the data lane 102 follows it according to the phase control signal P_CS (UP/FIX/DOWN) as indicated by ② in FIG. 5B.

The accompanying clock lane 103 has phase information representative of all data lanes and the phase information extracted by the clock data recovery circuit 303 (CDR) of the accompanying clock lane 103 is distributed to the clock data recovery circuits 303 (CDR) of the data lanes 102 through phase control signal P_CS (UP/FIX/DOWN). Usually when a clock is used for phase information, the clock's jitter component is also distributed to the clock data recovery circuits 303 (CDR) of the data lanes 102. However, the jitter component distributed to the data lanes can be reduced by using UP/DOWN signals as in this embodiment. This embodiment can be applied to a high-speed serial data reception system equipped with data lanes 102 and accompanying clock lanes 103.

Figure 6:
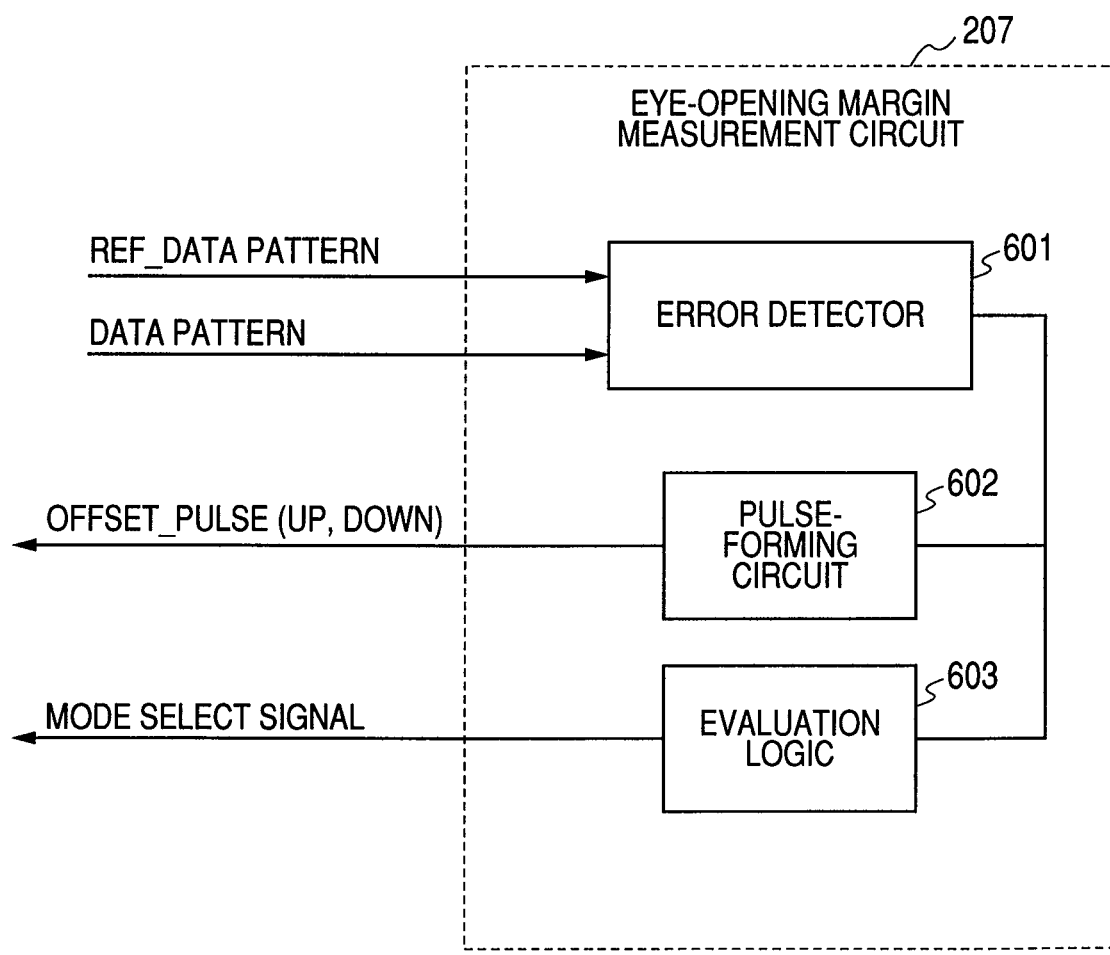
FIG. 6 is a block diagram of an eye-opening margin measurement circuit according to the embodiment of the invention.

FIG. 6 shows the configuration of the eye-opening margin measurement circuit 207 shown in FIG. 2. The circuit includes: an error detector 601 which detects errors at each clock phase and measures the eye-opening; a pulse-forming circuit 602 which shifts the pointer to each clock phase; and an evaluation logic 603 which controls eye-opening margin measurement.

The error detector 601 compares the received data pattern (Data Pattern) with the reference data pattern (Ref_Data Pattern) and decides whether or not they coincide with each other. As reference data pattern (Ref_Data Pattern), a pseudo random bit sequence(PRBS) is sent from a data generator to it. In eye-opening margin measurement, the same data pattern as the reference data pattern is sent from the sender LSI and received through the I/O circuit and SerDes circuit to the error detector 601 as an incoming or received data pattern.

The pulse-forming circuit 602 generates an offset pulse Offset_Pulse (UP, DOWN) which shifts the pointer to a clock phase. The evaluation logic circuit 603 controls the error detector 601 and the pulse-forming circuit 602 which generates a desired pulse depending on the amount of offset. The circuit 603 also sends a mode select signal to the selector circuit 206 and switches the phase control signal P_CS (UP/FIX/DOWN) having phase information of the accompanying clock lane 103 to the offset pulse signal generated by the pulse-forming circuit 602 or vice versa.

The eye-opening margin measurement circuit 207 according to the present invention is applicable to a serial data reception system which uses accompanying clock lanes as mentioned above. Furthermore, the eye-opening margin measurement circuit 207 is effective for a high-accuracy high-speed serial data reception system as mentioned above. When phase control signal P_CS (UP/FIX/DOWN) sent from an accompanying clock lane to data lanes is selected by the selector circuit 206, high-speed serial data can be received with high accuracy as mentioned above.

Figure 7:
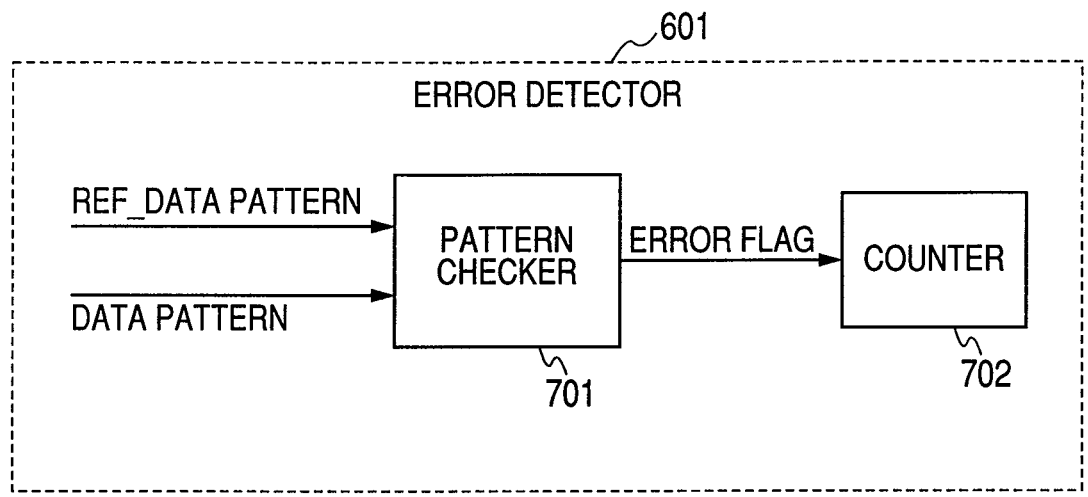
FIG. 7 is a block diagram of an error detector according to the embodiment of the invention.

FIG. 7 shows details of the error detector 601. The error detector 601 includes a pattern checker 701 and a counter 702. The pattern checker 701 compares the received data pattern (Data Pattern) with the reference data pattern (Ref_Data Pattern) and decides whether or not they coincide with each other. The counter 702 counts error flags from the pattern checker 701 and writes the error count in a register.

In a normal operational state where the clock data recovery circuit 303 (CDR) of the data lane 102 follows the phase information from the accompanying clock lane 103 as shown in FIG. 5B, the selector circuit 206 switches the phase control signal P_CS (UP/FIX/DOWN) generated by the clock data recovery circuit 303 (CDR) of the accompanying clock lane 103 to the offset pulse signal generated by the pulse-forming circuit or vice versa. This offset pulse creates various clock phases to count errors, so that it is possible to measure the eye-opening margin.

Figure 8:
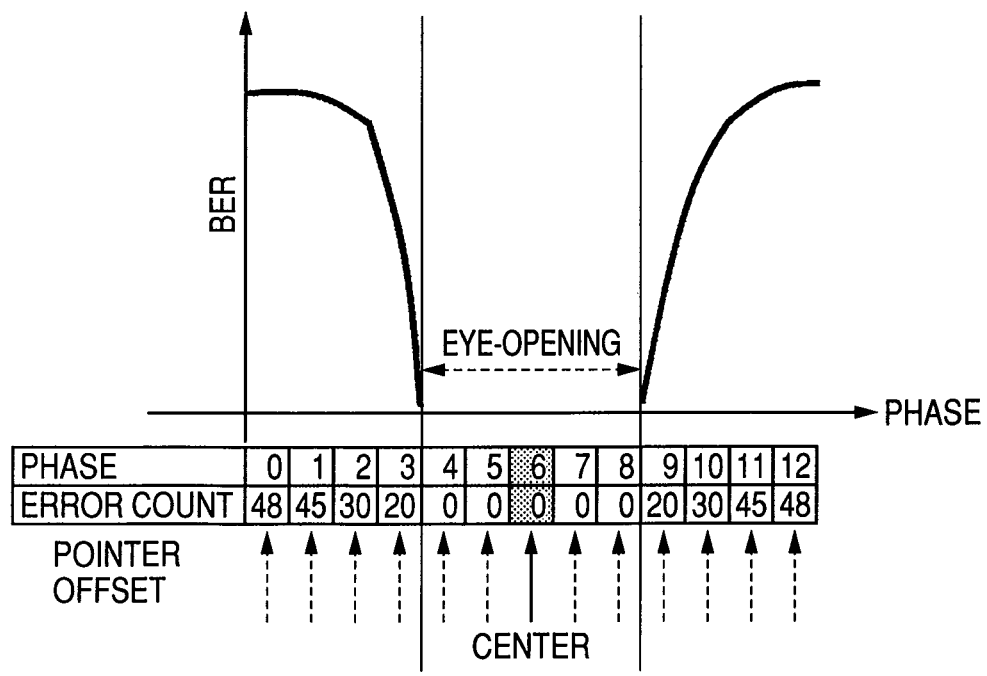
FIG. 8 is a conceptual diagram of eye-opening margin measurement according to the invention.

As shown in FIG. 8, for eye-opening margin measurement, comparison is made between the reference data pattern (Ref Data Pattern) and the received data pattern (Data pattern) and a non-coincidence is counted as an error. The phase zone in which the error count is zero is found and the eye-opening is measured.

In normal operation, as shown in FIG. 5A, the clock data recovery circuit 303 (CDR) of the data lane 102 is at an optimum clock phase (Center) which follows phase control signal P_CS (UP/FIX/DOWN) information from the accompanying clock lane 103.

In eye-opening margin measurement, the selector circuit 206 switches the phase control signal P_CS (UP/FIX/DOWN) to the offset pulse signal Offset_Pulse (UP/DOWN) according to a mode select signal. An offset pulse signal Offset_Pulse (UP/DOWN) is given to the pointer at the optimum clock phase (Center), and by sweeping the pointer to all clock phases, errors in received data are counted and the error count at each clock phase is written in the register. In eye-opening margin measurement, the same data pattern as the reference data pattern is sent from the sender LSI 101 and entered through the I/O circuit and SerDes circuit into the error detector 601 as received data pattern (Data Pattern).

The offset pulse signal from the eye-opening margin measurement circuit 207 enters the clock control circuit 405 through the selector circuit 206 and mode select circuit 404. The clock control circuit 405 updates the clock phase using an offset pulse and holds the updated clock phase and outputs phase information (Phase Info.) indicating the clock phase. The clock generation circuit 406 adjusts the current by switching operation according to an output signal from the clock control circuit 405 and generates clocks at different clock phases. The clock generation circuit 406 generates a clock whose phase is advanced by a clock phase incrementing signal UP or generates a clock whose phase is delayed by a clock phase decrementing signal DOWN.

Through the above sequence, the eye-opening margin is measured in a form as shown in FIG. 8 to evaluate the eye-opening. Also it is possible to plot a bathtub curve by converting error counts into bit error rates (BER).

Furthermore, since an offset pulse Offset_Pulse (UP/DOWN) is used to sweep the pointer position, it is possible to measure the eye-opening of the received data including the jitter component of the clock data recovery circuit 303 (CDR) of the data lane 102.

In a data communication system which uses the eye-opening margin measurement circuit, if the optimum eye-opening is not achieved, the eye-opening margin measurement circuit sends equalizer control signal E_CS to the I/O circuit 205 to adjust the equalizer and optimize the output amplitude.

Figure 9:
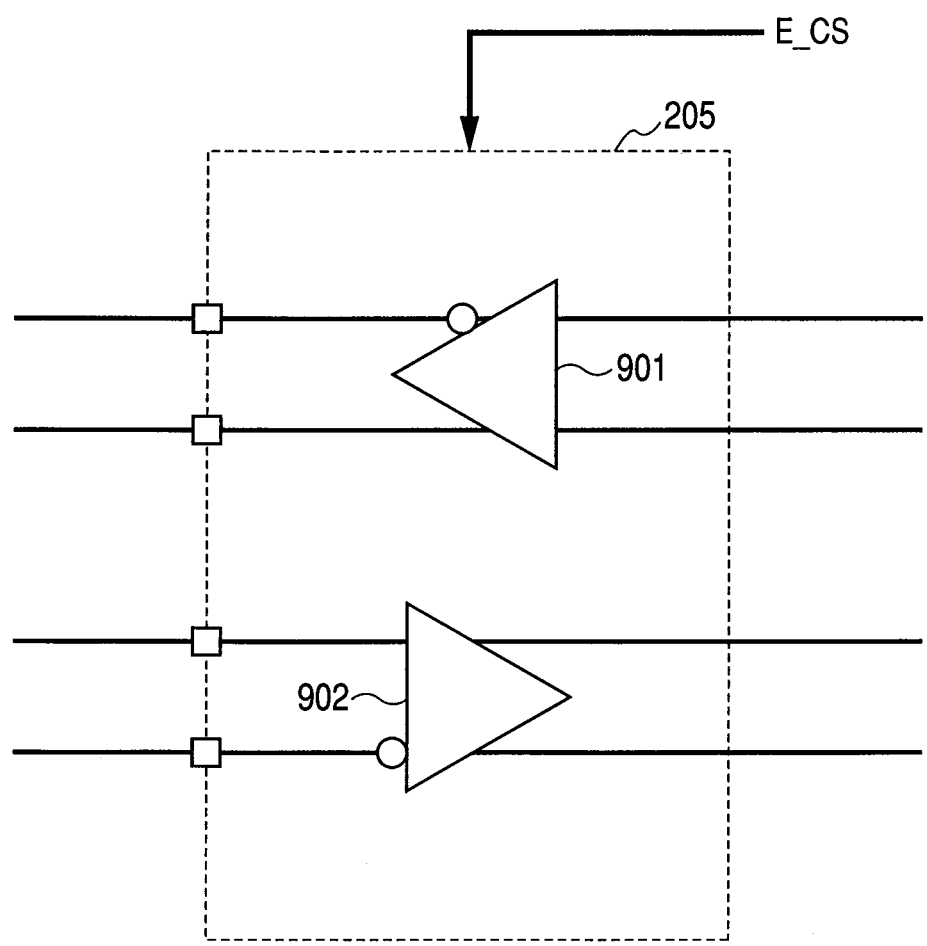
FIG. 9 is a block diagram of an input/output circuit (I/O) according to the embodiment of the invention.

FIG. 9 shows details of the I/O circuit 205. An output buffer 901 modifies the signal waveform so as to obtain the optimum waveform at the receiving circuit and sends serial data to the transmission line. If attenuation is serious in the transmission line, the high-frequency part which easily attenuates is pre-emphasized before transmission. If the output amplitude cannot be increased, the low-frequency part which is less likely to attenuate is de-emphasized before transmission. A waveform which causes less attenuation can be received by pre-emphasis or de-emphasis. An input buffer 902 can increase the input amplitude to an optimum level by equalizing the received data which has attenuated in the transmission line. By feedback of the result of eye-opening margin measurement to the equalizer in this way, the clock data recovery circuit 303 (CDR) can always receive high-speed serial data properly.

Figure 10:
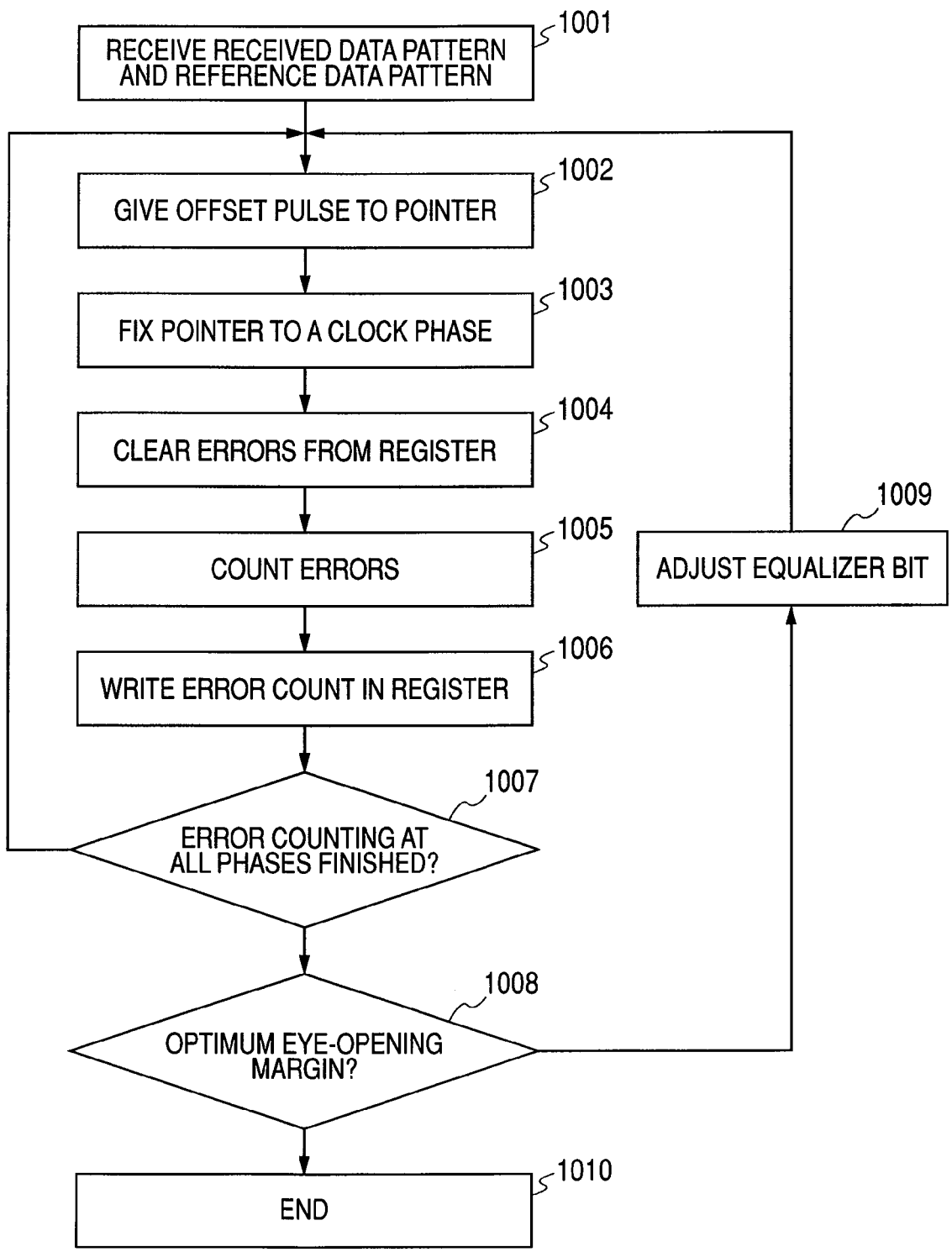
FIG. 10 shows an eye-opening margin measurement sequence.

FIG. 10 is a chart illustrating an eye-opening margin measurement sequence. At Step 1001, a pseudo random bit sequence (PRBS7/15/23/31) as reference data is received from a data generator. In eye-opening margin measurement, the same data pattern as the reference data pattern is sent from the sender LSI 101 and entered through the I/O circuit and SerDes circuit into the error detector 601 as received data pattern (Data Pattern). In the initial stage of operation, the received data (Parallel Data) whose clock phase is determined using the UP_0/FIX_0/DOWN_0 signal generated autonomously by each clock data recovery circuit 303 (CDR) is received. After the initial stage of operation, the clock data recovery circuit 303 (CDR) of each data lane follows the phase information of the phase control signal P_CS (UP/FIX/DOWN) generated by the clock data recovery circuit 303 (CDR) of the accompanying clock lane, so that the data is received with the optimum clock phase (Center). At Step 1002, the pointer is shifted to the clock phase at which errors are counted. The mode select circuit 206 switches between phase control signal P_CS (UP/FIX/DOWN) and offset pulse signal Offset_Pulse (UP/DOWN) according to a mode select signal. Offset_Pulse (UP/DOWN) is given from the pulse-forming circuit to the pointer at the optimum clock phase (Center) to shift the pointer to a clock phase at which errors are counted. At Step 1003, the pointer is fixed to a clock phase at which errors are counted. The selector circuit 206 switches the offset pulse signal Offset_Pulse (UP/DOWN) to phase control signal P_CS (UP/FIX/DOWN) of the accompanying clock lane and follows it with the pointer phase fixed. At Step 1004, errors are cleared from the register. At Step 1005, the pattern checker 701 compares the received data (Data Pattern) with the reference data (Ref_Data Pattern) during a desired number of cycles and sends an error flag to the counter 702 in case of non-coincidence. At Step 1006, the counter 702 counts error flags from the pattern checker 701 and writes the error count in the register. At Step 1007, a decision is made as to whether error counting has been finished at all phases. If it has not been finished, the sequence goes back to Step 1002, errors are counted at a different phase. At Step 1008, the eye-opening margin is measured. At step 1009, if the eye-opening is not optimum, a bit adjustment is made by the equalizer and again the steps from Step 1002 are carried out for eye-opening margin measurement. If attenuation is serious in the transmission line, the output buffer 901 makes an equalizer adjustment so that the high-frequency part which easily attenuates is pre-emphasized before transmission. The signal waveform is modified so as to obtain the optimum waveform at the receiving circuit before serial data is sent to the transmission line. If the output amplitude cannot be increased, the low-frequency part which is less likely to attenuate is de-emphasized before transmission. The input buffer 902 can increase the input amplitude to an optimum level by equalizing the received data which has attenuated in the transmission line. The equalizing method most suitable for each semiconductor device type or specification is used for the input and output buffers. At Step 1010, when measurements at all clock phases have been finished and the optimum eye-opening margin is obtained, or when a measurement end signal is received, the measurement sequence is ended.

The semiconductor device in this embodiment is effective for a training sequence in a serial data reception system.

The preferred embodiment of the present invention has been so far explained in detail. However, the invention is not limited thereto but it may be embodied in other forms without departing from the spirit and scope thereof.

What is claimed is:

1. A semiconductor integrated circuit device comprising:
   a pulse-forming circuit;
   a clock control circuit;
   a first clock generation circuit;
   a deserializer;
   an error detector;
   a phase detector; and
   a second clock generation circuit;
   wherein the pulse-forming circuit generates an offset pulse signal for incrementing a clock phase of a clock generated by the first clock generation circuit or an offset pulse signal for decrementing the clock phase;
   wherein the clock control circuit holds a clock phase updated by the offset pulse signal and outputs phase information indicating the clock phase;
   wherein the first clock generation circuit generates a recovery clock as a clock with a clock phase indicated by the phase information;
   wherein the deserializer converts serial data into parallel data using the recovery clock;
   wherein the error detector compares reference data, which is received through an accompanying clock lane, and the parallel data and decides whether or not the reference data and the parallel data coincide;
   wherein the phase detector compares a phase of serial data transmitted through the accompanying clock lane and a phase of a recovery clock generated by the second clock generation circuit, and if the recovery clock phase of the second clock generation circuit is delayed, it generates a phase delay signal for incrementing the clock phase of a recovery clock generated by the second clock generation circuit and if the recovery clock phase of the second clock generation circuit is advanced, it generates a phase advance signal for decrementing the clock phase of a recovery clock generated by the second clock generation circuit; and
   wherein the clock control circuit updates the clock phase held by it using the phase delay signal or the phase advance signal before receiving the offset pulse signal.

2. The semiconductor integrated circuit device according to claim 1,
   wherein the error detector has a counter, and
   wherein the counter counts non-coincidences between the reference data and the parallel data at each clock phase.

3. An eye-opening margin measurement method comprising the steps of:
   a pulse-forming circuit generates an offset pulse signal for incrementing a clock phase of a clock generated by a first clock generation circuit or an offset pulse signal for decrementing the clock phase;
   a clock control circuit holds a clock phase updated by the offset pulse signal and outputs phase information indicating the clock phase;
   the first clock generation circuit generates a recovery clock as a clock with a clock phase indicated by the phase information;
   a deserializer converts serial data into parallel data using the recovery clock; and
   an error detector compares reference data, which is received through an accompanying clock lane, and the parallel data and deciding whether or not the reference data and the parallel data coincide;
   wherein the phase detector compares a phase of serial data transmitted through the accompanying clock lane and a phase of a recovery clock generated by the second clock generation circuit, and if the recovery clock phase of the second clock generation circuit is delayed, it generates a phase delay signal for incrementing the clock phase of a recovery clock generated by the second clock generation circuit and if the recovery clock phase of the second clock generation circuit is advanced, it generates a phase advance signal for decrementing the clock phase of a recovery clock generated by the second clock generation circuit; and
   wherein the clock control circuit updates the clock phase held by it using the phase delay signal or the phase advance signal before receiving the offset pulse signal.

4. The eye-opening margin measurement method according to claim 3, wherein a counter counts non-coincidences between the reference data and the parallel data at each clock phase.

5. The eye-opening margin measurement method according to claim 4, wherein a phase zone in which the count of non-coincidences is zero is found to measure an eye-opening margin.

6. The eye-opening margin measurement method according to claim 3, wherein output amplitude of an input/output circuit which receives and outputs the serial data is changed depending on the measurement.

7. The eye-opening margin measurement method according to claim 3, wherein the serial data is received data as a serial form of the reference data.

* * * * *